United States Patent
Lovelace et al.

[11] Patent Number: 6,150,881
[45] Date of Patent: Nov. 21, 2000

[54] AMPLIFIER CIRCUIT WITH AMPLITUDE AND PHASE CORRECTION AND METHOD OF OPERATION

[75] Inventors: David K. Lovelace; Danielle L. Coffing; Jeffery C. Durec, all of Chandler, Ariz.

[73] Assignee: Motorola, Inc., Schaumburg, Ill.

[21] Appl. No.: 09/317,924

[22] Filed: May 25, 1999

[51] Int. Cl.[7] .................................................... H03F 3/45
[52] U.S. Cl. ........................... 330/252; 330/69; 330/259; 327/318; 327/359
[58] Field of Search .................................. 330/252, 253, 330/259, 69, 261; 327/359, 318

[56] References Cited

U.S. PATENT DOCUMENTS

| 5,008,632 | 4/1991 | Sutterlin | 330/259 |
| 5,644,264 | 7/1997 | Chiu et al. | 327/318 |
| 6,046,638 | 4/2000 | Hogeboom | 330/259 |

OTHER PUBLICATIONS

Holt "Electronic Circuits Digital and Analog" Copyright 1978 John Wiley & Sons, Inc, p. 427.

*Primary Examiner*—Michael B Shingleton
*Attorney, Agent, or Firm*—Lanny L. Parker

[57] ABSTRACT

A correction circuit (10) includes a transistor (30) that generates a feedback signal for equalizing the amplitude and adjusting the phase of the output signals ($V_{OUT-}$ and $V_{OUT+}$) that are provided at the output of the variable gain amplifier (10). The base terminal of the transistor (30) receives a summed value of the output signals ($V_{OUT-}$ and $V_{OUT+}$). The summed value is inverted and fed back to the differential transistors (12 and 14) and combined with the output signals ($V_{OUT-}$ and $V_{OUT+}$). The output signals ($V_{OUT-}$ and $V_{OUT+}$) have a proper amplitude and phase relationship when the summed value is substantially zero.

11 Claims, 3 Drawing Sheets

6,150,881

AMPLIFIER CIRCUIT WITH AMPLITUDE AND PHASE CORRECTION AND METHOD OF OPERATION

BACKGROUND OF THE INVENTION

The present invention relates, in general, to amplifier circuits, and more particularly, to amplitude and phase correction for amplifiers.

Amplifiers and buffers in a receiver often use a differential input stage to generate differential output signals that ideally are equal in amplitude and separated in phase by 180 degrees. Amplitude equalization and a stable phase relationship are required by mixer circuits that receive a Radio Frequency (RF) modulated signal. The RF signal is down-converted to a lower Intermediate Frequency (IF) according to buffered differential signals received from a local oscillator. The incoming modulated signal is frequency shifted and the modulation is recovered in the IF signal.

Mismatches in the characteristics of devices used in the differential input stage can occur during the processing operation of the integrated circuit, which causes undesired amplitude differences and phase imbalance of the generated differential output signals. Further, a single-ended signal received as an input of the differential input stage has different delay paths in generating each of the differential output signals. The difference in the delay paths causes an undesired phase relationship between the differential output signals, especially at high frequencies of the single-ended input signal.

Accordingly, it would be advantageous to have a differential input stage that generates differential output signals equal in amplitude and separated in phase by 180 degrees. It would be a further advantage for the differential input stage to operate at high frequencies while maintaining the desired differential phase and amplitude balance.

DETAILED DESCRIPTION OF THE DRAWINGS

Figure 1:
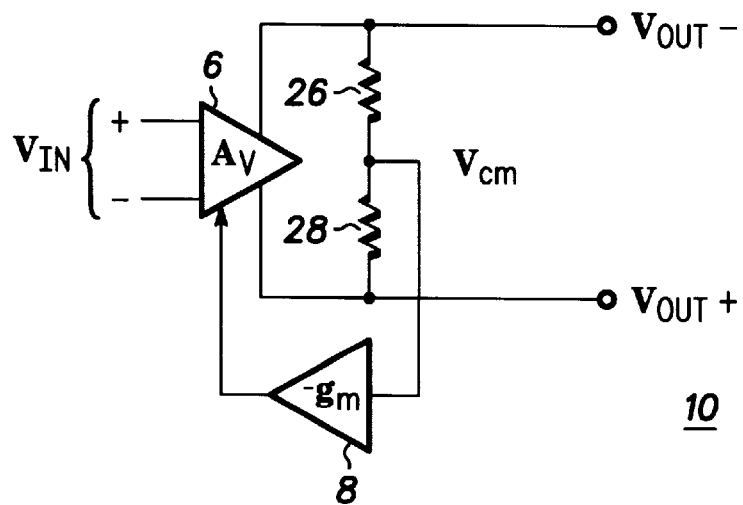
FIG. 1 is a block diagram of a variable gain amplifier having amplitude and phase correction.

FIG. 1 is a block diagram of an amplifier circuit 10 having a variable gain amplifier 6 coupled for receiving differential input signals and generating differential output signals $V_{OUT-}$ and $V_{OUT+}$. Resistors 26 and 28 generate a summed value of the signals $V_{OUT-}$ and $V_{OUT+}$ that is fed back to an inverting transconductance amplifier 8. Although resistors 26 and 28 are illustrated and described as resistors, these load devices could be inductors or capacitors. The signal generated at the output of inverting transconductance amplifier 8 is used to compensate over a wide range of frequencies for imbalances in the amplitude and phase of the differential signals $V_{OUT-}$ and $V_{OUT+}$. Amplifier circuit 10 has applications in amplifiers, buffers, and oscillators.

Figure 2:
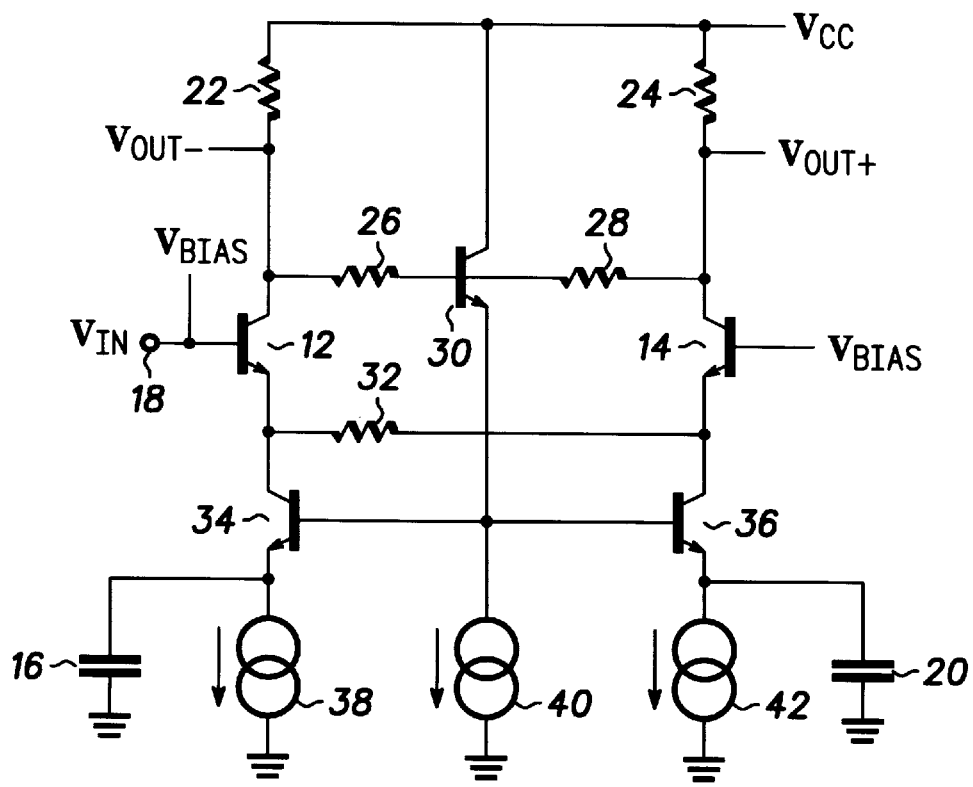
FIG. 2 is a schematic diagram of one embodiment for the variable gain amplifier of FIG. 1.

FIG. 2 is a schematic diagram of amplifier circuit 10. It should be noted that the same reference numbers are used in the figures to denote the same elements. As part of amplifier circuit 10, a differential pair of NPN transistors 12 and 14 receive an input signal. Although FIG. 2 illustrates a single-ended input signal is received at an input terminal 18, amplifier circuit 10 can be configured for receiving a differential input signal. The base terminal of transistor 12 receives a bias voltage $V_{BIAS}$ and is coupled to input terminal 18 for receiving the Alternating Current (AC) portion of the signal $V_{IN}$. The base terminal of transistor 14 also receives a bias voltage $V_{BIAS}$.

The collector terminals of transistors 12 and 14 are coupled through respective resistors 22 and 24 to a power supply conductor $V_{CC}$ of about 1.8 volts, or more. Resistors 22 and 24 have resistance values of about 500 ohms ($\Omega$). The differential output signals $V_{OUT-}$ and $V_{OUT+}$ are generated at the collector terminals of transistors 12 and 14, respectively. The emitter terminals of transistors 12 and 14 are coupled to each other through a degeneration resistor 32, having a resistance value of about 50 $\Omega$. The degeneration resistor lowers the gain of the differential amplifier and improves the linearity of the transfer function for amplifier circuit 10. The emitter terminal of transistor 12 is connected to the collector terminal of an NPN transistor 34 and the emitter terminal of transistor 14 is connected to the collector terminal of an NPN transistor 36. The emitter terminal of transistor 34 is coupled to the power supply conductor $V_{EE}$ through a current source 38 in parallel with a capacitor 16. The emitter terminal of transistor 36 is coupled to the power supply conductor $V_{EE}$ through a current source 42 in parallel with a capacitor 20.

A resistor 26 has one terminal connected to the collector terminal of transistor 12 and the other terminal connected to the base terminal of an NPN transistor 30. A resistor 28 has one terminal connected to the collector terminal of transistor 14 and the other terminal connected to the base terminal of transistor 30. Resistors 26 and 28 have resistance values of about 1 Kilohm (K$\Omega$). The collector terminal of transistor 30 is connected to the power supply conductor $V_{CC}$. The emitter terminal of transistor 30 is connected to the base terminals of transistors 34 and 36 and further coupled to the power supply conductor $V_{EE}$ through a current source 40.

Figure 3:
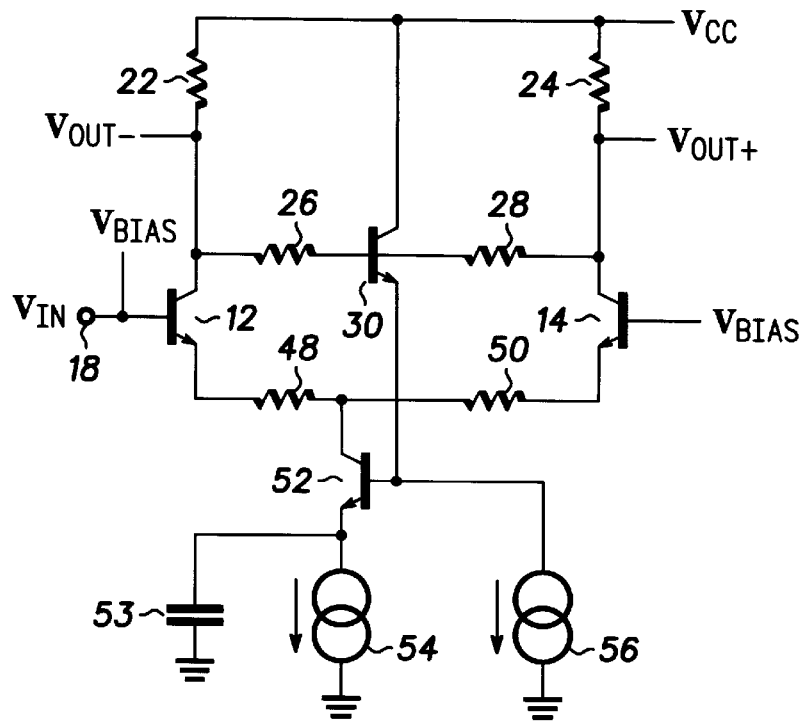
FIG. 3 is a schematic diagram of another embodiment for the variable gain amplifier.

FIG. 3 is a schematic diagram of another embodiment for amplifier circuit 10. In this embodiment, the transistors 34 and 36 of FIG. 2 have been replaced by an NPN transistor 52. The emitter terminal of transistor 12 is coupled to the collector terminal of transistor 52 via a resistor 48. The emitter terminal of transistor 14 is coupled to the collector terminal of transistor 52 via a resistor 50. In this embodiment, the use of resistors 48 and 50 is optional. The emitter terminal of transistor 30 is connected to the base terminal of transistor 52 and further coupled to the power supply conductor $V_{EE}$ through a current source 56. The emitter terminal of transistor 52 is coupled to the power supply conductor $V_{EE}$ through a current source 54 in parallel with a capacitor 53.

Figure 4:
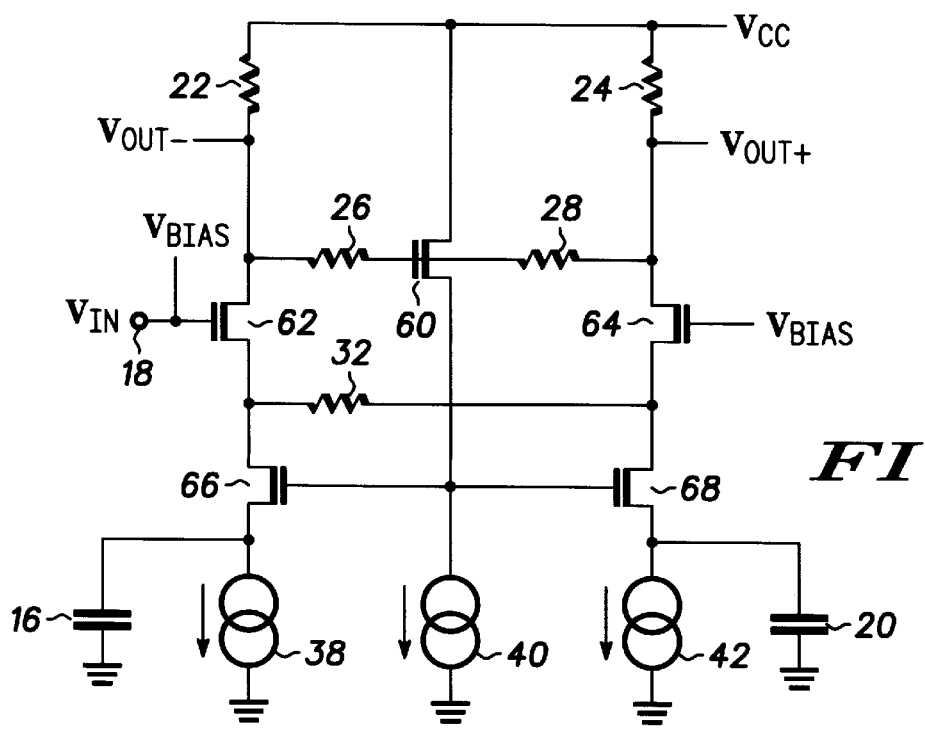
FIG. 4 is a schematic diagram using MOSFETs for the variable gain amplifier of FIG. 1.

FIG. 4 is a schematic diagram of yet another embodiment for amplifier circuit 10. In this embodiment, the bipolar transistors 12, 14, 30, 34, and 36 of FIG. 2 have been replaced by corresponding Metal Oxide Semiconductor Field Effect Transistors (MOSFETs) 62, 64, 60, 66, and 68.

Figure 5:
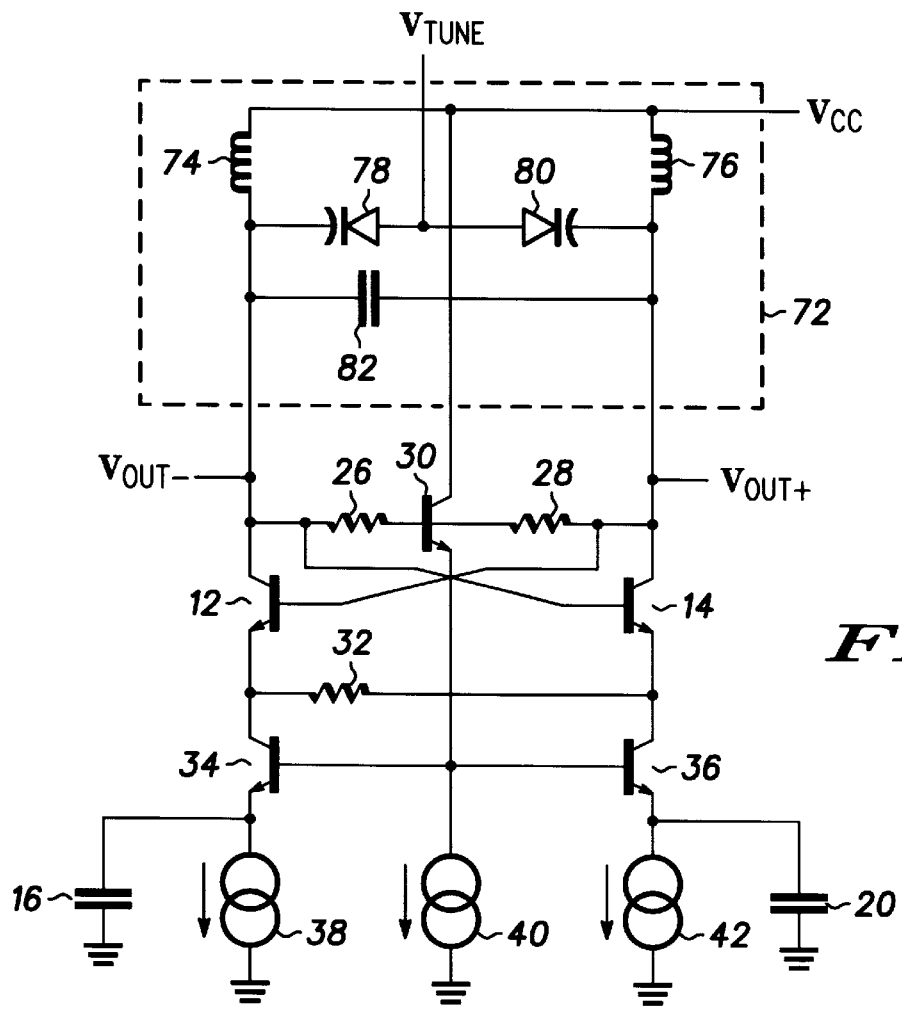
FIG. 5 is a schematic diagram for a differential voltage controlled oscillator.

FIG. 5 is a schematic diagram for a differential Voltage Controlled Oscillator 70. The configuration of differential voltage controlled oscillator 70 in FIG. 5 differs from amplifier circuit 10 (see FIG. 1) in that the load resistors 22 and 24 of amplifier circuit 10 have been replaced by a tank circuit 72. Tank circuit 72 includes an inductor 74 that couples the collector terminal of transistor 12 to the power supply conductor $V_{CC}$. An inductor 76 couples the collector terminal of transistor 14 to the power supply conductor $V_{CC}$. A capacitor 82 couples the collector terminal of transistor 12 to the collector terminal of transistor 14. Tank circuit 72 further includes varactor diodes 78 and 80. The cathode of diode 78 is connected to the collector terminal of transistor 12 and the cathode of diode 80 is connected to the collector terminal of transistor 14. The commonly connected anodes of diodes 78 and 80 are coupled for receiving a tuning voltage $V_{TUNE}$.

The configuration of differential voltage controlled oscillator 70 (see FIG. 4) also differs from amplifier circuit 10 (see FIG. 1) in that the base terminals of transistors 12 and 14 are cross-coupled. The base terminal of transistor 12 is connected to the collector terminal of transistor 14 and the base terminal of transistor 14 is connected to the collector terminal of transistor 12.

In operation, referring to FIG. 1, it is desired that the signals $V_{OUT-}$ and $V_{OUT+}$ be equal in amplitude, but opposite in phase, i.e., the phase of the signal $V_{OUT-}$ should be shifted 180 degrees with respect to the phase of the signal $V_{OUT+}$. When mismatches occur in the devices of amplifier circuit 10, undesired amplitude and phase relationships can exist between the signals $V_{OUT-}$ and $V_{OUT+}$. For instance, mismatches in the transistor current conduction characteristics, caused during the manufacturing operation, can occur in the processing of the integrated circuit. Transistor mismatches also cause differences in tail currents, i.e., the current conducted through current sources 38, 40, and 42. Mismatches in the load resistors, i.e., resistors 22 and 24, also cause undesired imbalances between the signals $V_{OUT-}$ and $V_{OUT+}$.

In addition, a single-ended signal received at input terminal 18 has a different delay path when generating the signal $V_{OUT-}$ as compared to generating the signal $V_{OUT+}$. One delay path includes receiving the signal $V_{IN}$ at the base terminal of transistor 12 that causes a collector conduction current that generates the signal $V_{OUT-}$ across resistor 22. The other delay path includes receiving the signal $V_{IN}$ at the base terminal of transistor 12 that causes a current through degeneration resistor 32, followed by transistor 14 providing a collector conduction current that generates the signal $V_{OUT+}$ across resistor 24. Thus, the delay path through transistor 12 in generating the signal $V_{OUT-}$ is different from the delay path through transistors 12 and 14 in generating the signal $V_{OUT+}$. The difference in the delay paths cause an undesired phase relationship between the differential output signals, especially at high frequencies of the signal $V_{IN}$.

To compensate for imbalances in the amplitude and phase of the differential signals $V_{OUT-}$ and $V_{OUT+}$, the differential signals are summed through resistors 26 and 28 and the summed value supplied to the base of transistor 30. The summed value is zero, i.e., an AC ground, when the signals $V_{OUT-}$ and $V_{OUT+}$ are balanced, meaning that the amplitudes of the signals are equalized and the signals are shifted 180 degrees with respect to each other. However, when the signals $V_{OUT-}$ and $V_{OUT+}$ are not balanced, the summed value is not zero and transistor 30 conducts a current to the base terminals of transistors 34 and 36.

By way of example, the signals $V_{OUT-}$ and $V_{OUT+}$ can be represented by vectors in describing the amplitude and the phase relationship between the two signals.

In this example the signal $V_{OUT-}$ is illustrated as having a phase of 0 degrees, but the signal $V_{OUT+}$ is illustrated as having a phase that is not shifted by 180 degrees with respect to the signal $V_{OUT-}$. In addition, the amplitudes of the signals $V_{OUT-}$ and $V_{OUT+}$ are not matched. The summed value that is generated at the base terminal of transistor 30 is represented by an error vector as follows:

error vector

\

Although vectors are used as a visual aid to represent a signal's amplitude and phase, for ease of description the vectors are also discussed as signals. Transistor 30 is a follower circuit that feeds back the error vector to the base terminals of transistors 34 and 36. Transistors 34 and 36 invert the error vector in providing an inverted error vector, i.e., an inverted summed value, to the emitter terminals of the differential transistors 12 and 14. For this example, the error vector that is fed back through transistor 12 opposes the vector for $V_{OUT-}$, causing the amplitude of the signal $V_{OUT-}$ to decrease. However, the error vector fed back through transistor 14 aids the vector for $V_{OUT+}$, causing the amplitude of the signal $V_{OUT+}$ to increase. The error vector also adjusts the phase separation between the signals $V_{OUT-}$ and $V_{OUT+}$. This dynamic process of equalizing the amplitude and adjusting the phase of the signals $V_{OUT-}$ and $V_{OUT+}$ continues until the newly generated error vector is minimized. When the summed value, as represented by the error vector, has the value of zero, the signals $V_{OUT-}$ and $V_{OUT+}$ are balanced, the amplitudes of the signals are equalized, and the signals are shifted by 180 degrees with respect to each other.

The summed value is generated by amplifier circuit 10 when the signals $V_{OUT-}$ and $V_{OUT+}$ have unequalized amplitudes, phase mismatches, or a combination of both. Transistor 30 provides the feedback signal for amplitude and phase corrections that increase the operating bandwidth of the input stage. Amplifier circuit 10 operates, for example, at frequencies of about 3.5 GigaHertz (GHz) or less.

Referring to FIG. 3, transistor 30 provides the feedback signal to the base terminal of transistor 52. The feedback signal is inverted by transistor 52 and supplied to the emitter terminals of differential transistors 12 and 14. The inverted feedback signal is used by the differential transistors 12 and 14 to dynamically correct the amplitude and phase of the differential signals $V_{OUT-}$ and $V_{OUT+}$.

Referring now to FIG. 3, MOSFET 60 provides the feedback signal to the gate terminals of MOSFETs 66 and 68. The feedback signal is inverted by MOSFETs 66 and 68 and supplied to the source terminals of differential MOSFETs 62 and 64. The inverted feedback signal is used by the differential MOSFETs 62 and 64 to dynamically correct the amplitude and phase of the differential signals $V_{OUT-}$ and $V_{OUT+}$.

Referring to FIG. 4, VCO 70 generates differential output signals $V_{OUT-}$ and $V_{OUT+}$ that have amplitude and phase correction supplied through the feedback signal from transistor 30. The feedback signal is inverted by transistors 34 and 36 and supplied to the emitter terminals of differential transistors 12 and 14. The inverted feedback signal is used by the differential transistors 12 and 14 to dynamically equalize the amplitude and adjust the phase of the differential signals $V_{OUT-}$ and $V_{OUT+}$. The cross-coupled bases of the differential transistors 12 and 14, along with tank circuit 72, cause VCO 70 to supply output signal that oscillate at the desired frequency.

By now it should be appreciated that the present invention provides a differential stage having a feedback signal for equalizing the amplitude and adjusting the phase of the differential output signals. Mismatches in the devices of the differential stage cause undesired amplitude and phase relationships in the differential output signals that can be corrected through the use of the feedback signal. By dynamically correcting the amplitude and phase of the differential signals, the operating bandwidth of the differential stage is improved.

What is claimed is:

1. An amplifier circuit, comprising:

a differential transistor pair that provides first and second output signals;

a first load having a first terminal coupled for receiving the first output signal;

a second load having a first terminal coupled for receiving the second output signal;

a feedback transistor having a control terminal coupled to second terminals of the first and second loads and a first conduction terminal coupled to a first power conductor;

a signal-inverting transistor having a control terminal coupled to a second conduction terminal of the feedback transistor, a first conduction terminal coupled to a second power conductor, and a second conduction terminal coupled to commonly coupled terminals of the differential transistor pair;

a first current source having a first terminal coupled to the second conduction terminal of the feedback transistor and a second terminal coupled to the second power conductor; and a second current source having a first terminal coupled to the first conduction terminal of the signal-inverting transistor and a second terminal coupled to the second power conductor.

2. The amplifier circuit of claim 1, further including a resistor having a first terminal coupled to the second conduction terminal of the signal-inverting transistor, where the commonly coupled terminals of the differential transistor pair are coupled to each other through the resistor.

3. The amplifier circuit of claim 1, further including:

a first output resistor having a first terminal coupled to the first power conductor and a second terminal coupled for receiving the first output signal; and a second output resistor having a first terminal coupled to the first power conductor and a second terminal coupled for receiving the second output signal.

4. The amplifier circuit of claim 1, further including:

a first inductor having a first terminal coupled to the first power conductor and a second terminal coupled for receiving the first output signal; and a second inductor having a first terminal coupled to the first power conductor and a second terminal coupled for receiving the second output signal.

5. The amplifier circuit of claim 4, further including:

a first varactor having a cathode coupled to the second terminal of the first inductor; and a second varactor having a cathode coupled to the second terminal of the second inductor and an anode coupled to an anode of the first varactor.

6. The amplifier circuit of claim 5, further including a capacitor having a first terminal coupled to the cathode of the first varactor and a second terminal coupled to the cathode of the second varactor.

7. An amplifier circuit having a differential transistor pair with commonly coupled first conduction terminals and second conduction terminals that provide a differential output signal, comprising:

serially connected loads coupled between the second conduction terminals of the differential transistor pair and providing a summed value of the differential output signals;

a feedback transistor having a control terminal coupled for receiving the summed value and a first conduction terminal coupled to a first power conductor;

a signal-inverting transistor having a control terminal coupled to a second conduction terminal of the feedback transistor, a first conduction terminal coupled to a second power conductor, and a second conduction terminal coupled to the commonly coupled first conduction terminals of the differential transistor pair;

a first current source having a first terminal coupled to the second conduction terminal of the feedback transistor and a second terminal coupled to the second power conductor; and a second current source having a first terminal coupled to the first conduction terminal of the signal-inverting transistor and a second terminal coupled to the second power conductor.

8. The amplifier circuit of claim 7, further including a degeneration resistor coupled between the first conduction terminals of the differential transistor pair.

9. The amplifier circuit of claim 7, further including first and second output resistors for coupling the first power conductor to the second conduction terminals of the differential transistor pair.

10. The amplifier circuit of claim 7, further including a tank circuit having first and second inductors for coupling the first power conductor to the second conduction terminals of the differential transistor pair.

11. The amplifier circuit of claim 10, wherein the tank circuit further includes first and second serially connected varactors having commonly coupled anodes and cathodes coupled to the second terminals of the differential transistor pair.

* * * * *